United States Patent
Cho et al.

(10) Patent No.: US 9,064,545 B2
(45) Date of Patent: Jun. 23, 2015

(54) NONVOLATILE MEMORY DEVICE HAVING ADJUSTABLE PROGRAM PULSE WIDTH

(71) Applicant: SAMSUNG ELECTRONICS CO., LTD., Suwon-Si, Gyeonggi-Do (KR)

(72) Inventors: Yongsung Cho, Suwon-si (KR); Kihwan Choi, Seongnam-si (KR); Il Han Park, Suwon-si (KR); Kiwhan Song, Seoul (KR); Sangyong Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 246 days.

(21) Appl. No.: 13/721,859

(22) Filed: Dec. 20, 2012

(65) Prior Publication Data

US 2013/0223143 A1  Aug. 29, 2013

(30) Foreign Application Priority Data

Feb. 29, 2012  (KR) .................. 10-2012-0021059

(51) Int. Cl.
*G11C 16/04* (2006.01)
*G11C 7/04* (2006.01)
*G11C 16/10* (2006.01)

(52) U.S. Cl.
CPC .............. *G11C 7/04* (2013.01); *G11C 16/0483* (2013.01); *G11C 16/10* (2013.01)

(58) Field of Classification Search
USPC ..................... 365/185.03, 218, 211
See application file for complete search history.

(56) References Cited

U.S. PATENT DOCUMENTS

| 7,120,074 B2* | 10/2006 | Proell et al. .................. 365/212 |
| 7,466,597 B2* | 12/2008 | Kim ........................ 365/185.28 |
| 7,778,066 B2 | 8/2010 | Horii et al. |
| 7,869,273 B2 | 1/2011 | Lee et al. |
| 7,978,520 B2 | 7/2011 | Mokhlesi et al. |
| 8,644,074 B2* | 2/2014 | Chang et al. ............. 365/185.17 |
| 2005/0078537 A1* | 4/2005 | So et al. ....................... 365/211 |
| 2010/0195387 A1 | 8/2010 | Park |

FOREIGN PATENT DOCUMENTS

| KR | 1020090020342 A | 2/2009 |
| KR | 1020100088468 A | 8/2010 |
| KR | 1020100101694 A | 9/2010 |

* cited by examiner

*Primary Examiner* — Pho M Luu
(74) *Attorney, Agent, or Firm* — Valentine & Whitt, PLLC

(57) ABSTRACT

A method of programming a nonvolatile memory device comprises determining a temperature condition of the nonvolatile memory device, determining a program pulse period according to the temperature condition, supplying a program voltage to a selected word line using the program pulse period, and supplying a pass voltage to unselected word lines while supplying the program voltage to the selected word line.

20 Claims, 17 Drawing Sheets

NONVOLATILE MEMORY DEVICE HAVING ADJUSTABLE PROGRAM PULSE WIDTH

CROSS-REFERENCE TO RELATED APPLICATIONS

This application claims priority under 35 U.S.C. §119 to Korean Patent Application No. 10-2012-0021059 filed Feb. 29, 2012, the subject matter of which is hereby incorporated by reference in its entirety.

BACKGROUND OF THE INVENTION

The inventive concept relates generally to electronic memory technologies. More particularly, the inventive concept relates to a semiconductor memory device and a memory system comprising the same.

Semiconductor memories form an important part of many digital logic systems, such as computers and microprocessor-based applications ranging from satellites to consumer electronics. Consequently, advances in the semiconductor memory technologies can have a significant impact on the performance of a wide variety of technologies.

Semiconductor memory devices can be characterized generally as volatile memory devices, which lose stored data when disconnected from power, or nonvolatile memory devices, which retain stored data when disconnected from power. Examples of volatile memory devices include static random access memory (SRAM) and dynamic random access memory (DRAM), and examples of nonvolatile memory devices include Mask Read-Only Memory (MROM), Programmable Read-Only Memory (PROM), Erasable Programmable Read-Only Memory (EPROM), and Electrically Erasable Programmable Read-Only Memory (EEPROM).

In an effort to improve the storage capacity of certain types of nonvolatile memory devices, researchers have developed nonvolatile memory devices capable of storing more than one bit of data per memory cell. Such memory devices are commonly referred to as multi-level cell (MLC) memory devices or multi-bit memory devices. An example of a nonvolatile memory device storing more than one bit of data per memory cell is flash memory.

One potential drawback of storing multiple bits of data per memory cell is that it may decrease the reliability of stored data. One cause of this decreased reliability in flash memory devices is that increasing the number of bits per memory cell tends to decrease the margins between threshold voltage distributions corresponding to programmed states. Moreover, with the decreased read margins, the memory cells are increasingly susceptible to the effects of various forms of noise and undesirable electrical effects.

As an example, as the margins between threshold voltage distributions decrease, erase disturbance may become a limiting factor in the design of the threshold voltage distributions, as illustrated by the following. A boosting level of program-inhibited memory cells may be determined by a leakage current characteristic, and may vary according to temperature, program bias conditions, and a physical location of a selected word line. Moreover, in a NAND flash memory device, a channel region of a string including a program-inhibited memory cell may be boosted by a word line bias (e.g., a pass voltage and a program voltage) at a floated state. A channel boosting level may be determined by a voltage applied to a word line, a coupling ratio between a word line and a channel, and a leakage current of a channel region. As the boosting level decreases, the erase disturbance may be exacerbated, which can cause a decrease in a margin between an erase state and a lower-most program state. Accordingly, deterioration of the erase disturbance may become a substantial factor of deteriorating the reliability of a nonvolatile memory device.

SUMMARY OF THE INVENTION

In one embodiment of the inventive concept, a method of programming a nonvolatile memory device comprises determining a temperature condition of the nonvolatile memory device, determining a program pulse period according to the temperature condition, supplying a program voltage to a selected word line using the program pulse period, and supplying a pass voltage to unselected word lines while supplying the program voltage to the selected word line.

In another embodiment of the inventive concept, a nonvolatile memory device comprises a memory cell array comprising memory cells arranged in word lines and bit lines, an address decoder configured to select one of the word lines of the memory cell array, a temperature code generator circuit configured to detect a current temperature of the nonvolatile memory device and generate a temperature code corresponding to the detected current temperature, and control logic configured to control a program pulse period of a program voltage to be applied to the selected word line through the address decoder in response to the temperature code.

In another embodiment of the inventive concept, a memory system comprises a nonvolatile memory device, and a memory controller connected to the nonvolatile memory device via a channel and configured to control the nonvolatile memory device. The memory controller determines whether a program-erase cycle number of the nonvolatile memory device reaches a program-erase cycle number and changes a program pulse period of the nonvolatile memory device according to a result of the determination.

These and other embodiments of the inventive concept can potentially improve the performance and reliability of nonvolatile memory devices and systems by reducing the effects of erase disturbance.

BRIEF DESCRIPTION OF THE DRAWINGS

The drawings illustrate selected embodiments of the inventive concept. In the drawings, like reference numbers indicate like features.

DETAILED DESCRIPTION

Figure 1:
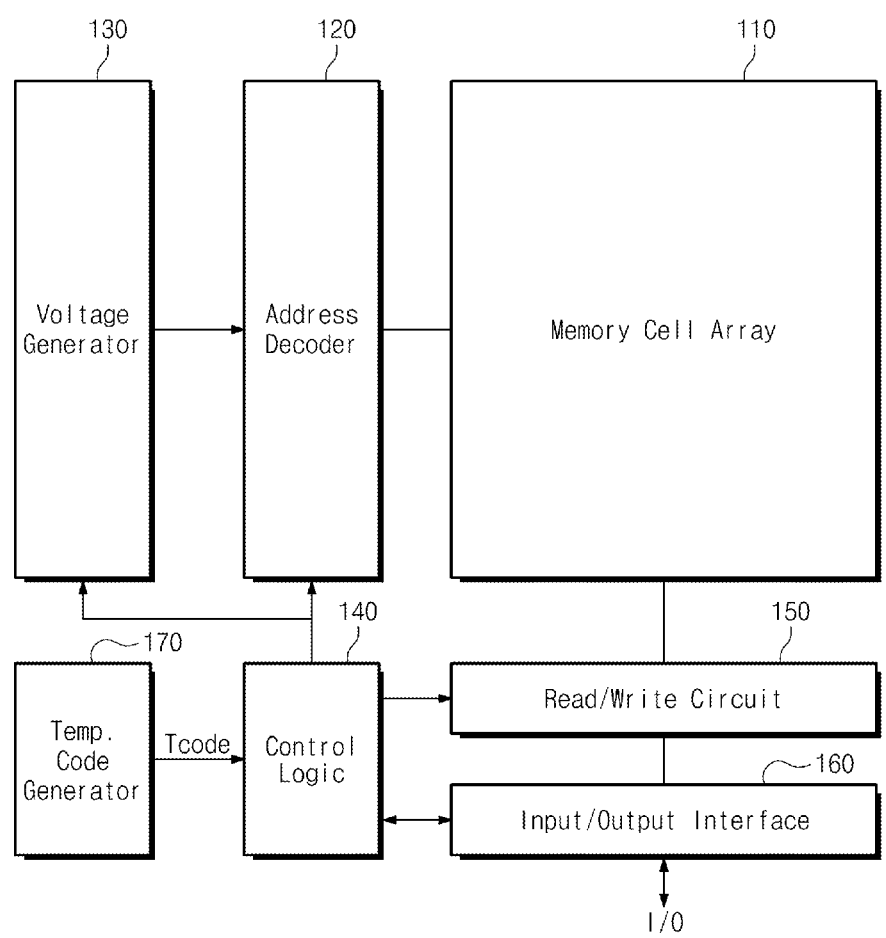
FIG. 1 is a block diagram of a nonvolatile memory device according to an embodiment of the inventive concept.

Embodiments of the inventive concept are described below with reference to the accompanying drawings. These embodiments are presented as teaching examples and should not be construed to limit the scope of the inventive concept.

In the description that follows, the terms first, second, third etc. may be used to describe various features, but the described features should not be limited by these terms. Rather, these terms are used merely to distinguish between different features. Thus, a first feature could be termed a second feature without departing from the relevant teachings.

Spatially relative terms, such as "beneath", "below", "lower", "under", "above", "upper" and the like, may be used herein for ease of description to describe one feature's relationship to another feature(s) as illustrated in the drawings. The spatially relative terms are intended to encompass different orientations of the device in use or operation in addition to the orientation depicted in the drawings. For example, if the device in the drawings is turned over, features described as "below" or "beneath" or "under" other features would then be oriented "above" the other features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that where a feature is referred to as being "between" two other features, it can be the only feature between the two feature, or one or more intervening features may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. Terms such as "comprises," "comprising," "includes," "including," and the like, where used in this specification, indicate the presence of stated features but do not preclude the presence of other features. As used herein, the term "and/or" indicates any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or this specification and will not be interpreted in an idealized or overly formal sense unless expressly so defined herein.

The described embodiments relate generally to nonvolatile memory devices and systems incorporating nonvolatile memory devices. In certain embodiments described below, a nonvolatile memory device is designed to mitigate performance deterioration that may arise due to erase disturbance.

FIG. 1 is a block diagram of a nonvolatile memory device according to an embodiment of the inventive concept. The nonvolatile memory device can be a NAND flash memory device, for example. However, it is not limited to a NAND flash memory device, and could take alternative forms such as a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, a Spin Transfer Torque Random Access Memory (STT-RAM), and the like. Further, the nonvolatile memory device can be implemented to have a three-dimensional array structure. A nonvolatile memory device with the three-dimensional array structure may be referred to as a vertical NAND flash memory device. Certain embodiments may include a Charge Trap Flash (CTF) memory device having a charge storage layer formed of an insulation film, or a flash memory device including a charge storage layer formed of a conductive floating gate.

Referring to FIG. 1, the nonvolatile memory device comprises a memory cell array 110, an address decoder 120, a voltage generator 130, control logic 140, a read/write circuit 150 (also referred to as a "page buffer circuit"), an input/output interface 160, and a temperature code generator circuit 170.

Memory cell array 110 comprises memory cells arranged at intersections of rows corresponding to word lines and columns corresponding to bit lines. Each memory cell stores 1-bit data or multi-bit data (M>2). Address decoder 120 is controlled by control logic 140, and it may perform selecting and driving operations on rows (e.g., word lines, a string selection line(s), a ground selection line(s), a common source line, etc.) of memory cell array 110. Voltage generator 130 is controlled by control logic 140, and it generates voltages required for each operation such as a high voltage, a program voltage, a read voltage, a verification voltage, an erase voltage, a pass voltage, a bulk voltage, and the like. Voltages generated by voltage generator 130 may be provided to memory cell array 110 via address decoder 120.

Read/write circuit 150 is controlled by control logic 140, and it is configured to read data from memory cell array 110 and to drive columns (e.g., bit lines) of memory cell array 110 according to program data. Read/write circuit 150 comprises page buffers respectively corresponding to bit lines or bit line pairs. Each of the page buffers comprises a plurality of latches. Input/output interface 160 is controlled by control logic 140 is configured to interface with an external device. Although not illustrated in FIG. 1, input/output interface 160 comprises a column decoder configured to select page buffers of read/write circuit 150 by a predetermined unit, an input buffer receiving data, an output buffer outputting data, and the like.

Temperature code generator circuit 170 detects a temperature of the nonvolatile memory device and provides control logic 140 with a temperature code Tcode corresponding to a result of the detection. Control logic 140 controls overall operations of the nonvolatile memory device. Control logic 140 determines a program condition according to temperature code Tcode from temperature code generator circuit 170. In other words, a program condition may be changed according to temperature code Tcode. The program condition typically comprises a program pulse time during which a program pulse (or, a program pulse voltage) is applied. Control logic 140 may also change a program condition (or, a program pulse time) according to at least one of a current temperature, a location of a selected word line, a level of a program pulse voltage, or a program-erase cycle number. By controlling program conditions in this manner, the nonvolatile memory device may suppress or prevent programming of memory cells that should remain in an erase state.

Figure 2:
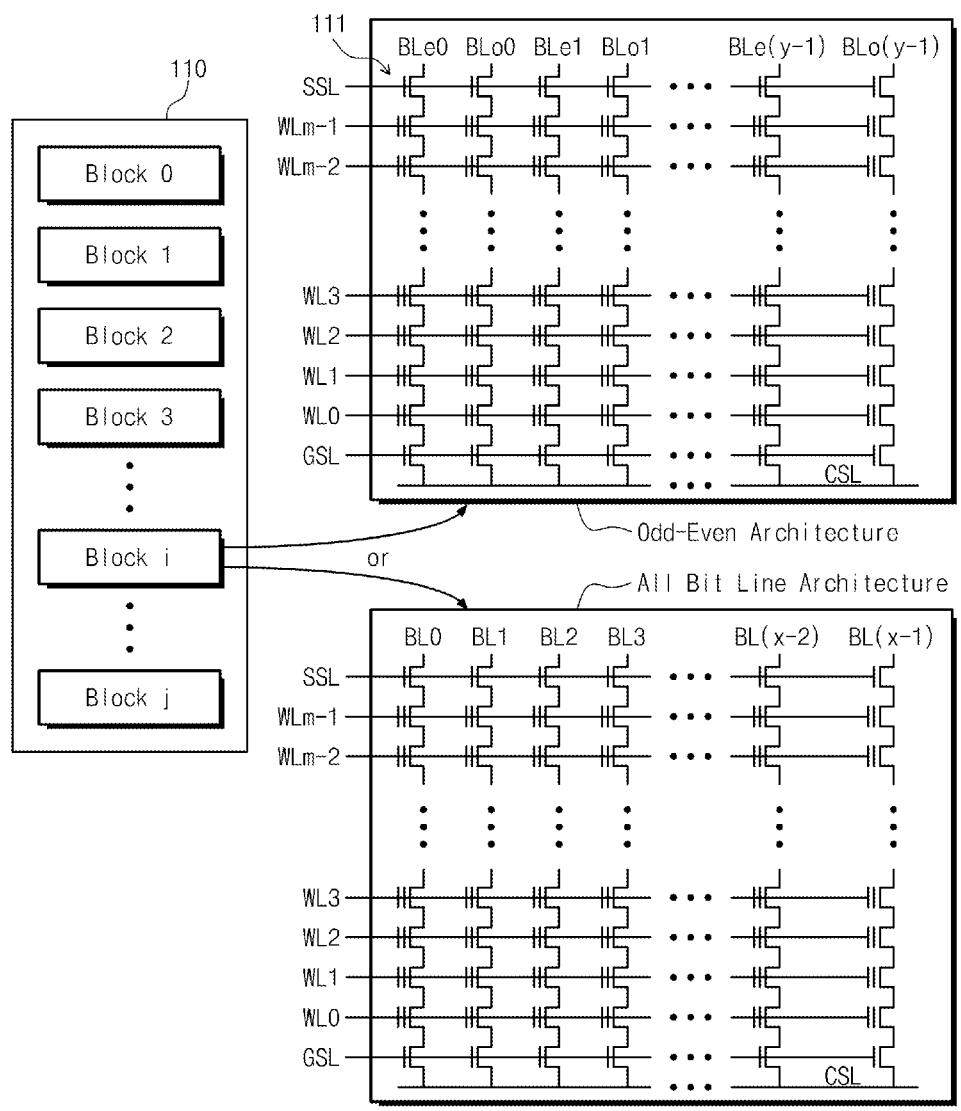
FIG. 2 is a diagram of a memory cell array having an all bit line memory architecture or an odd-even memory architecture according to an embodiment of the inventive concept.

FIG. 2 is a diagram of a memory cell array having an all bit line memory architecture or an odd-even memory architecture. The memory cell array of FIG. 2 is presented as one example of memory cell array 110. In this example, a NAND flash memory device comprises memory cell array 110 partitioned into 1024 blocks. Data stored in each block may be simultaneously erased. In one embodiment, the memory block may be the minimum unit of storage elements that are simultaneously erased. Each memory block, for example, may have columns each corresponding to bit lines (e.g., bit lines of 1 KB). In an embodiment referred to as the all bit line (ABL) architecture, all the bit lines of a memory block are capable of being simultaneously selected during read and program operations. Storage elements in a common word line and connected to all bit lines may be capable of being programmed at the same time.

In some embodiments, multiple storage elements in the same column are connected in series to form a NAND string 111. One end of NAND string 111 is connected to a corresponding bit line via a selection transistor which is controlled by a string selection line SSL, and the other end may be connected to a common source line CSL via a selection transistor which is controlled by a ground selection line GSL.

In some embodiments, referred to as the odd-even architecture, bit lines are divided into even bit lines (BLe) and odd bit lines (BLo). In the odd/even bit line architecture, storage elements in a common word line and connected to the odd bit lines are programmed at a first time, and storage elements in the common word line and connected to even bit lines are programmed at a second time. Data can be programmed and read into and from different blocks. Such operations are capable of being performed at the same time.

Figure 3:
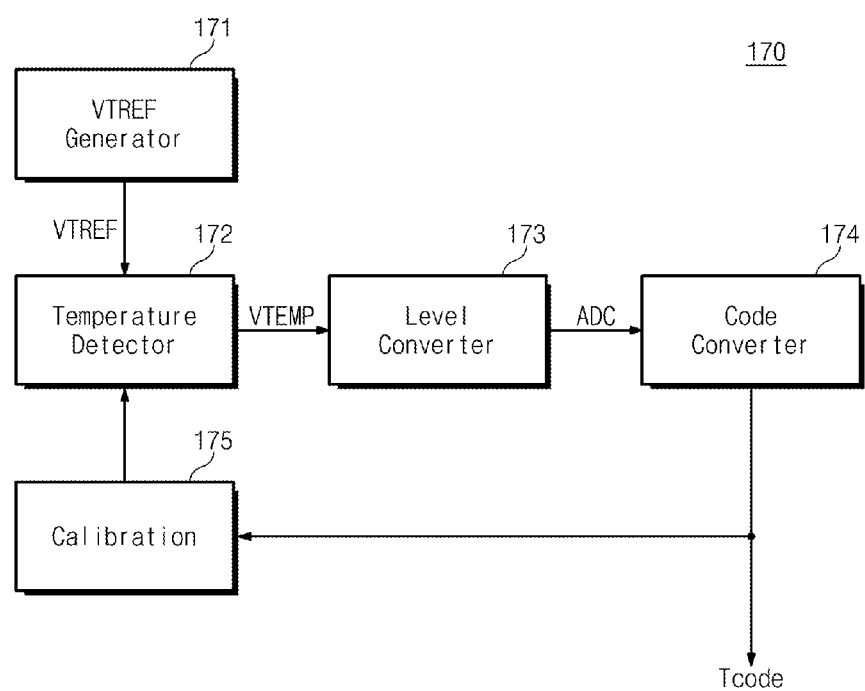
FIG. 3 is a block diagram of a temperature code generator circuit illustrated in FIG. 1 according to an embodiment of the inventive concept.

FIG. 3 is a block diagram of temperature code generator circuit 170 of FIG. 1 according to an embodiment of the inventive concept.

Referring to FIG. 3, temperature code generator circuit 170 comprises a reference voltage generator 171 for generating a reference voltage VTREF stably/constantly regardless of a temperature variation, a temperature detector 172 for generating a temperature voltage VTEMP corresponding to a current temperature in response to reference voltage VTREF, a level converter 173 for converting temperature voltage VTEMP of an analog fashion into a digital code ADC, and a temperature code converter 174 for converting digital code ADC into a temperature code Tcode.

Temperature code converter 174 can be used to reduce the number of bits of digital code ADC, and the number of bits of temperature code Tcode may be less than that of digital code ADC. Temperature code generator circuit 170 further comprises a calibration part 175 that determines whether temperature code Tcode is set to a value corresponding to a default temperature (e.g., the highest temperature, the lowest temperature, or an intermediate temperature of an allowable temperature range) and controls temperature detector 172 according to a result of the determination. An output voltage VTEMP of temperature detector 172 is varied under control of calibration part 175. Output voltage VTEMP of temperature detector 172 can be varied until temperature code Tcode is set to a value corresponding to a default temperature (e.g., the highest temperature, the lowest temperature, or an intermediate temperature of an allowable temperature range). Calibration part 175, for example, may operate at a test operation and be inactivated at a normal operation.

Figure 4:
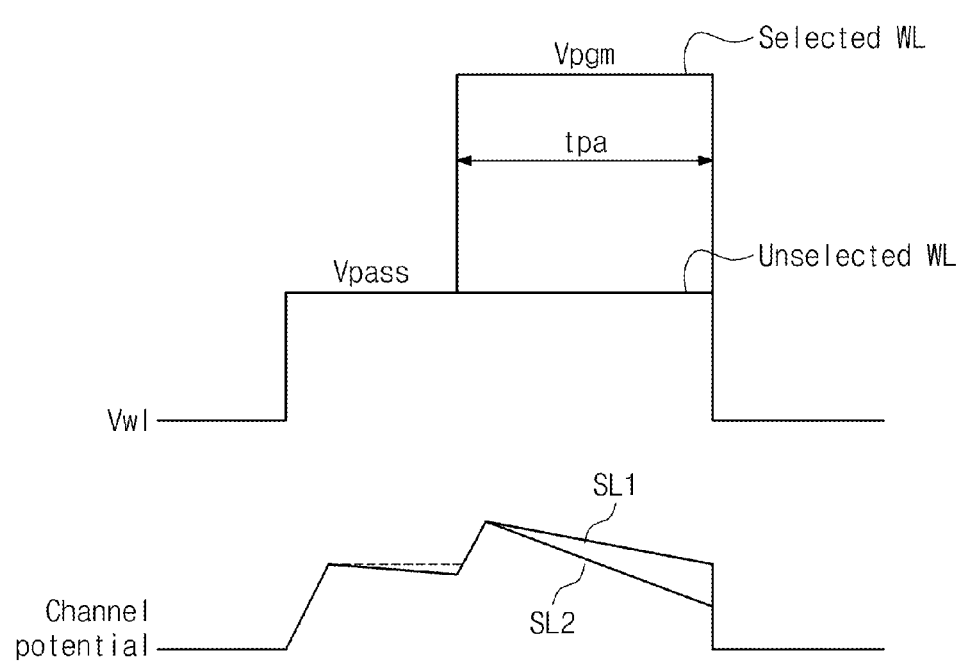
FIG. 4 is a diagram illustrating a correlation between a word line voltage and a channel potential in a program operation of a nonvolatile memory device according to an embodiment of the inventive concept.

FIG. 4 is a diagram illustrating a correlation between a word line voltage and a channel potential in a program operation of a nonvolatile memory device according to an embodiment of the inventive concept.

In a program operation, a bit line of a string comprising a memory cell to be programmed is supplied with a bit line program voltage (e.g., 0V), and a bit line of a string comprising a memory cell to be program inhibited is supplied with a bit line program-inhibition voltage (e.g., a power supply voltage). Under these conditions, a string selection voltage (e.g., a power supply voltage) is applied to a string selection line. Moreover, with these bias conditions, a channel of a string including a memory cell to be programmed is electrically connected with a bit line, while a channel of a string including a memory cell to be program inhibited is electrically isolated from a bit line. As a pass voltage Vpass is applied to word lines of a selected memory block under the above-described bias conditions, a channel region of a string including a memory cell to be program inhibited is boosted as illustrated in FIG. 4. A boosted potential of a channel region may gradually lowered due to a leakage current.

Subsequently, a program voltage Vpgm is applied to a selected word line, and a channel region of a string including a memory cell to be program inhibited is boosted by the coupling between the word line and the channel region. During a program pulse period in which a program voltage Vpgm is maintained at a constant value, as illustrated in FIG. 4, a boosted level is gradually lowered. This phenomenon may have various causes. For example, this phenomenon may be generated due to junction leakage current, DIDL, and the like. As time elapses within a program pulse period tpa, the chance that a memory cell having an erase state experiences disturbance may increase. A boosted level of a channel region may be lowered according different slopes SL1 and SL2 according to locations of word lines, a temperature, a level of a program voltage, a program-erase cycle number, and the like.

Although FIG. 4 illustrates an example where a boosted level is lowered according to two slopes, the inventive concept is not limited to this example. For example, a boosted level may be lowered according to three or more slopes based on locations of word lines, a temperature, a level of a program voltage, a program-erase cycle number, and the like.

As indicated in the description of FIG. 4, as a boosted level is lowered, a potential difference between a word line and a channel may increase. This may result in programming of a memory cell intended to be program inhibited. To prevent this from happening, the nonvolatile memory device may be configured to variably control the program pulse period tpa. For example, the program pulse period tpa can be variably controlled according to at least one of a temperature, a physical location of a selected word line, a level of a program pulse voltage, and a program-erase cycle number.

Figure 5:
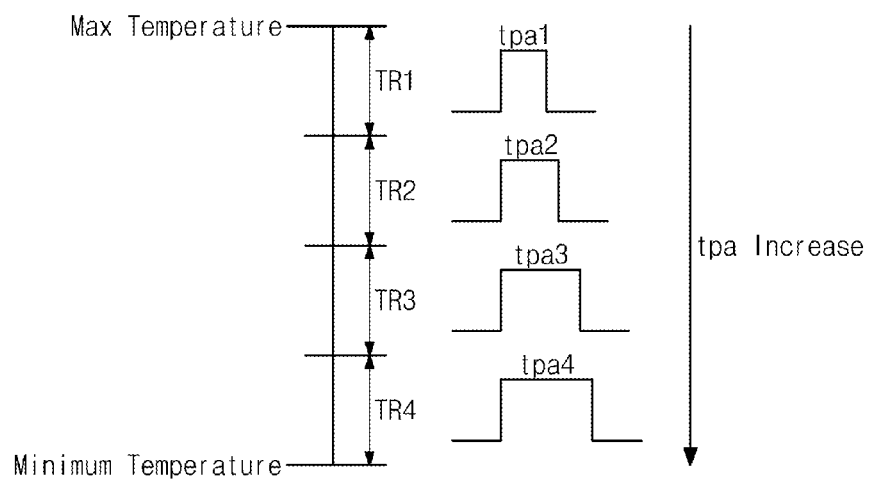
FIG. 5 is a diagram illustrating a method of determining a program pulse period of a nonvolatile memory device according to an embodiment of the inventive concept.

FIG. 5 is a diagram illustrating a method of determining a program pulse period of a nonvolatile memory device according to an embodiment of the inventive concept.

As a general assumption, an allowable temperature range of a nonvolatile memory device may be defined by a highest temperature (e.g., 85° C.) and a lowest temperature (e.g., −25° C.), although the inventive concept is not limited to a specific temperature range. The allowable temperature range typically comprises a plurality of temperature regions. In the example of FIG. 5, it is assumed that the allowable temperature range has four temperature regions TR1, TR2, TR3, and TR4, although the number of temperature regions in the allowable temperature range is not limited to this example.

A boosted level of a channel region, for example, may be lowered due to a junction leakage current, and the junction leakage current may vary according to a temperature. Consequently, a decreasing slope of a boosted level of a channel region differs according to temperature. For example, as a temperature increases, a decreasing slope of a boosted level of a channel region may increase. As the decreasing slope of a boosted level of a channel region increases, the boosted level of the channel region may be lowered within a relatively short time. On the other hand, as temperature decreases, a decreasing slope of a boosted level of a channel region may decrease. As the decreasing slope of a boosted level of a channel region decreases, the boosted level of the channel region may be lowered within a relatively long time.

As indicated by the foregoing, erase disturbance may be deteriorated when a boosted level of a channel region is lowered. Lowering of a boosted level of a channel region may produce an increase in a voltage difference between a word line and a channel. As illustrated in FIG. 4, a voltage difference between a word line and a channel at the second half of a program pulse period tpa may be larger than that at the first half of the program pulse period tpa. Thus, it is possible to reduce a voltage difference between a word line and a channel by shortening a program pulse period tpa according to a variation in a temperature.

In certain embodiments, the program pulse period tpa is controlled to be varied in inverse proportion to a temperature variation as illustrated in FIG. 5. For example, as temperature decreases, the program pulse period tpa may be increased. On the other hand, as a temperature increases, the program pulse period tpa may be decreased. The program pulse period tpa is typically varied under the control of control logic 140. For example, in a program operation, temperature code generator circuit 170 may generate a temperature code Tcode on the basis of a current temperature, and control logic 140 may determine a program pulse period tpa according to a temperature region corresponding to a temperature code Tcode indicating a current temperature. Control logic 140 controls address decoder 120 such that a program voltage is supplied to a selected word line during the determined program pulse period tpa.

In some embodiments, data (e.g., trim information) indicating correlation between temperature regions and program pulse periods may be stored in a register of control logic 140. Such data may be stored in a specific area of memory cell array 110 and then loaded to the register of control logic 140 at power-up.

Figure 6:
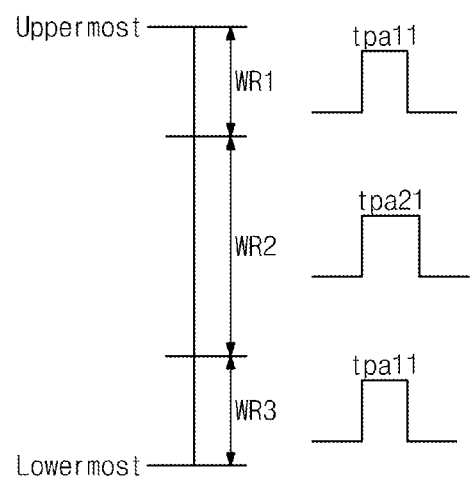
FIG. 6 is a diagram illustrating a method of determining a program pulse period of a nonvolatile memory device according to another embodiment of the inventive concept.

FIG. 6 is a diagram illustrating a method of determining a program pulse period of a nonvolatile memory device according to another embodiment of the inventive concept.

In the embodiment of FIG. 6, word lines of a memory block are divided into a plurality of word line regions. For example, word lines of a memory block are divided into three word line regions WR1, WR2, and WR3, although the number of word line regions may vary in alternative embodiments. For example, word lines of a memory block may be divided into two word line regions or four or more word line regions.

A junction leakage current varies according to a location of a word line. For example, a channel voltage corresponding to memory cells of word lines belonging to word line regions WR1 and WR3 may be lowered faster than that belonging to a word line region WR2. In other words, compared with a channel region corresponding to memory cells of word lines belonging to word line region WR2, a relatively much amount of junction leakage current may be generated at channel regions corresponding to memory cells of word lines belonging to word line regions WR1 and WR3. For this reason, a voltage difference between a word line and a channel may be reduced by controlling a program pulse period tpa according to a location of a word line (i.e., a selected word line).

As illustrated in FIG. 6, a program pulse period tpa21 applied to word line region WR2 may be longer than a program pulse period tpa11 applied to word line regions WR1 and WR3. Program pulse period tpa11 applied to a word line region where the amount of junction leakage current is relatively larger may be shorter than the program pulse period tpa21 applied to a word line region where the amount of junction leakage current is relatively smaller. Thus, a voltage difference between a word line and a channel may be reduced by applying a relatively short program pulse period to a word line region where the amount of junction leakage current is relatively larger. This may prevent or suppress erase disturbance on an erased memory cell from being deteriorated.

In some embodiments, program pulse periods applied to word line regions WR1 and WR3 may be determined to be equal to each other. Alternatively, program pulse periods applied to word line regions WR1 and WR3 may be determined to be different from each other. In the latter situation, program pulse periods applied to word line regions WR1 and WR3 may be shorter than a program pulse period applied to word line region WR2.

In some embodiments, word lines of a memory block are divided into two word line regions WR1 and (WR2, WR3). In this situation, a program pulse period tpa21 may be applied to the word line region (WR2, WR3), and a program pulse period tpa11 may be applied to word line region WR1.

In some embodiments, word line region WR1 comprises at least one word line (e.g., the uppermost word line) adjacent to a string selection line, word line region WR3 comprises at least one word line (e.g., the lowermost word line) adjacent to a common source line, and word line region WR2 comprises the remaining word lines. However, the number of word lines in each of word line regions WR1 and WR3 can be changed variously.

In some embodiments, a program pulse period applied to each word line region may change according to temperature. For example, a program pulse period applied to each word line region may be controlled to become relatively shorter at an increase in a temperature and to become relatively longer at a decrease in a temperature.

In some embodiments, data (or, trim information) indicating correlation between temperature regions and program pulse periods may be stored in a register of control logic 140. Such data may be stored in a specific area of a memory cell array 110, and may be loaded into the register of control logic 140 at power-up.

Figure 7:
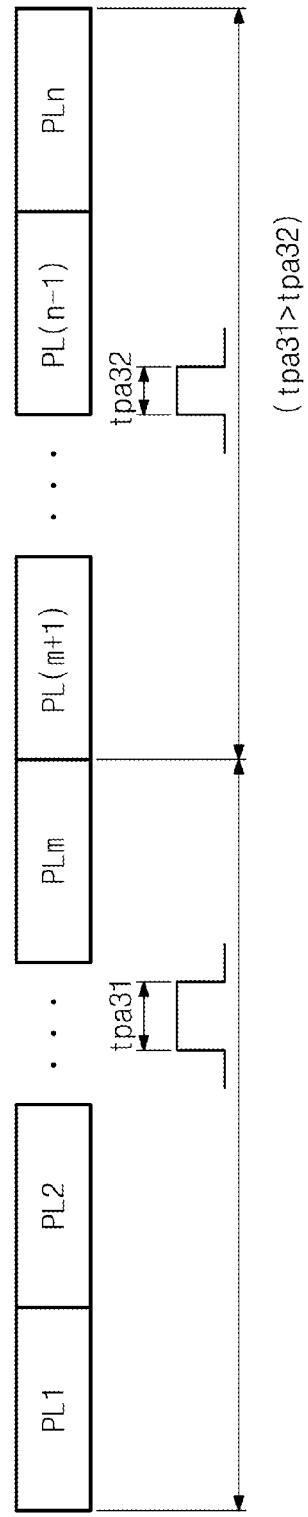
FIG. 7 is a diagram illustrating a method of determining a program pulse period of a nonvolatile memory device according to still another embodiment of the inventive concept.

FIG. 7 is a diagram illustrating a method of determining a program pulse period of a nonvolatile memory device according to still another embodiment of the inventive concept.

In the embodiment of FIG. 7, a nonvolatile memory device performs a program operation using incremental step pulse programming (ISPP). In the ISPP, a program voltage increases in a stepwise fashion in successive program loops. Accordingly, as a boosted voltage of a channel region is being lowered due to a junction leakage current, the program voltage may gradually increase in successive program loops. This results in a gradually increasing voltage difference between a word line and a channel. As a result, erase disturbance on an erased memory cell may be reduced.

As indicated above, in a nonvolatile memory device according to certain embodiments of the inventive concept may control a program pulse period according to whether a current program loop reaches a specific program loop. For example, referring to FIG. 7, where a current program loop does not reach a specific program loop, control logic 140 of the nonvolatile may control an address decoder 120 such that a program voltage is supplied to a word line during a first program pulse period tpa31. Where a current program loop reaches a specific program loop, control logic 140 of the nonvolatile may control address decoder 120 such that a program voltage is supplied to a word line during a second program pulse period tpa32. Second program pulse period tpa32 may be shorter than first program pulse period tpa31. That is, at a program operation, a program pulse period in which a program voltage is constantly maintained may change according to a program voltage. Because second program pulse period tpa32 may be shorter than first program pulse period tpa31, it is possible to reduce a voltage difference between word line and a channel after the specific program loop. That is, it is possible to prevent/suppress erase disturbance on a memory cell having an erase state from being deteriorated after the specific program loop.

As indicated by the above description, deterioration of the erase disturbance may be improved by reducing a program pulse period. Although not shown in drawings, the program pulse period may be determined according to factors such as a word line develop time determined according to word line loading, the amount of F-N tunneling of a memory cell to be programmed, and the like.

In some embodiments, different factors used to determine a program pulse period (e.g., a temperature, a word line location, and a program voltage) may be used independently. For example, a program pulse period may be determined in light of a temperature, a word line location, or a program voltage. On the other hand, at least two of factors (e.g., a temperature, a word line location, and a program voltage) used to determine a program pulse period may be used together. For example, a program pulse period may be determined in light of a temperature, a word line location, and a program voltage or in light of a word line location and a program voltage. However, a combination of factors needed to determine a program pulse period is not limited to this disclosure. For example, a program-erase cycle number may be used together to determine a program pulse period.

Figure 8A:
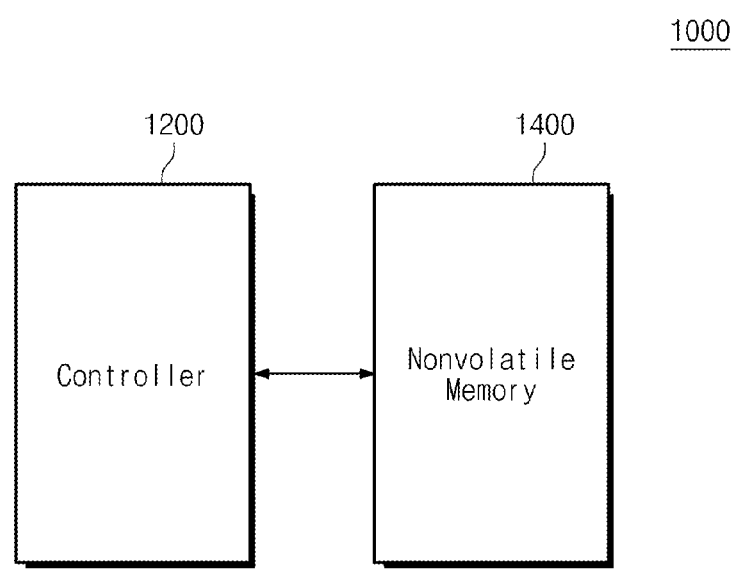
FIG. 8A is a block diagram of a memory system according to an embodiment of the inventive concept.
Figure 8B:
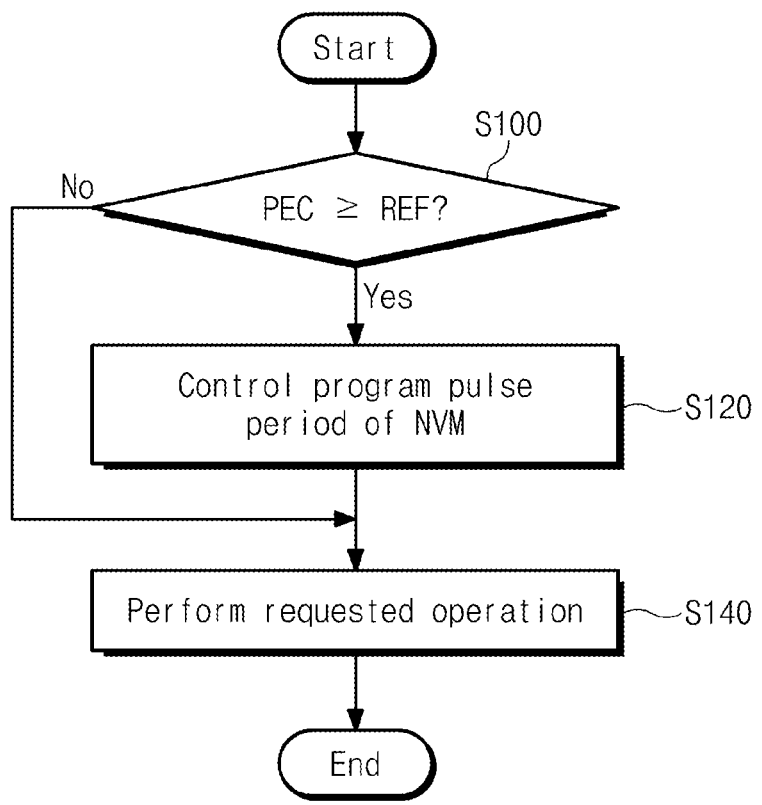
FIG. 8B is a flowchart illustrating a method of operating the memory system of FIG. 8A according to an embodiment of the inventive concept.

FIG. 8A is a block diagram of a memory system 1000 according to an embodiment of the inventive concept. FIG. 8B is a flowchart illustrating a method of operating a memory system in FIG. 8A according to an embodiment of the inventive concept.

Referring to FIG. 8A, memory system 1000 comprises a memory controller 1200 and a nonvolatile memory device 1400, which is a multi-bit memory device. Controller 1200 is configured to control nonvolatile memory device 1400 according to a request of an external device (e.g., host) or an internal request (e.g., an operation associated with sudden power-off, background operations such as merge, garbage collection, etc.). Nonvolatile memory device 1400 operates under the control of memory controller 1200, and it is used as a type of storage medium to store data information. The storage medium may be formed of one or more memory chips. Nonvolatile memory device 1400 communicates with memory controller 1200 via one or more channels. Nonvolatile memory device 1400 may comprise a NAND flash memory device, for example.

Memory controller 1200 manages a program-erase cycle number of nonvolatile memory device 1400. Memory controller 1200 determines whether a program-erase cycle number of nonvolatile memory device 1400 reaches a specific number. Where the program-erase cycle number of nonvolatile memory device 1400 reaches the specific number, memory controller 1200 controls nonvolatile memory device 1400 such that there is varied a program pulse period where a program voltage is constantly maintained. For example, where the program-erase cycle number of nonvolatile memory device 1400 reaches the specific number, memory controller 1200 may control nonvolatile memory device 1400 such that the program pulse period is shortened.

Nonvolatile memory device 1400 can be configured similar to one or more embodiments described above in relation to FIGS. 1 to 9. Accordingly, in response to information indicating that the program-erase cycle number of nonvolatile memory device 1400 reaches the specific number, nonvolatile memory device 1400 shortens a program pulse period determined according to the above-described factors (e.g., a temperature, a word line location, and a program voltage).

Referring to FIG. 8B, a method of operating memory system 1000 comprises determining whether a program-erase cycle number PEC of nonvolatile memory device 1400 reaches a specific number REF (S100), controlling a program pulse period of nonvolatile memory device 1400 so as to become relatively short when the program-erase cycle number PEC of nonvolatile memory device 1400 reaches the specific number REF (S120), and executing a requested operation (S140). Where the program-erase cycle number PEC of nonvolatile memory device 1400 is determined not to reach the specific number REF, the requested operation may be executed without controlling of the program pulse period of nonvolatile memory device 1400.

In some embodiments, whether a program-erase cycle number PEC of nonvolatile memory device 1400 reaches a specific number REF may be indicated in various manners. For example, such notification may be performed using a set feature command at power-up. Alternatively, such notification may be performed whenever a program operation is requested. However, the inventive concept is not limited to these examples.

Figure 9:
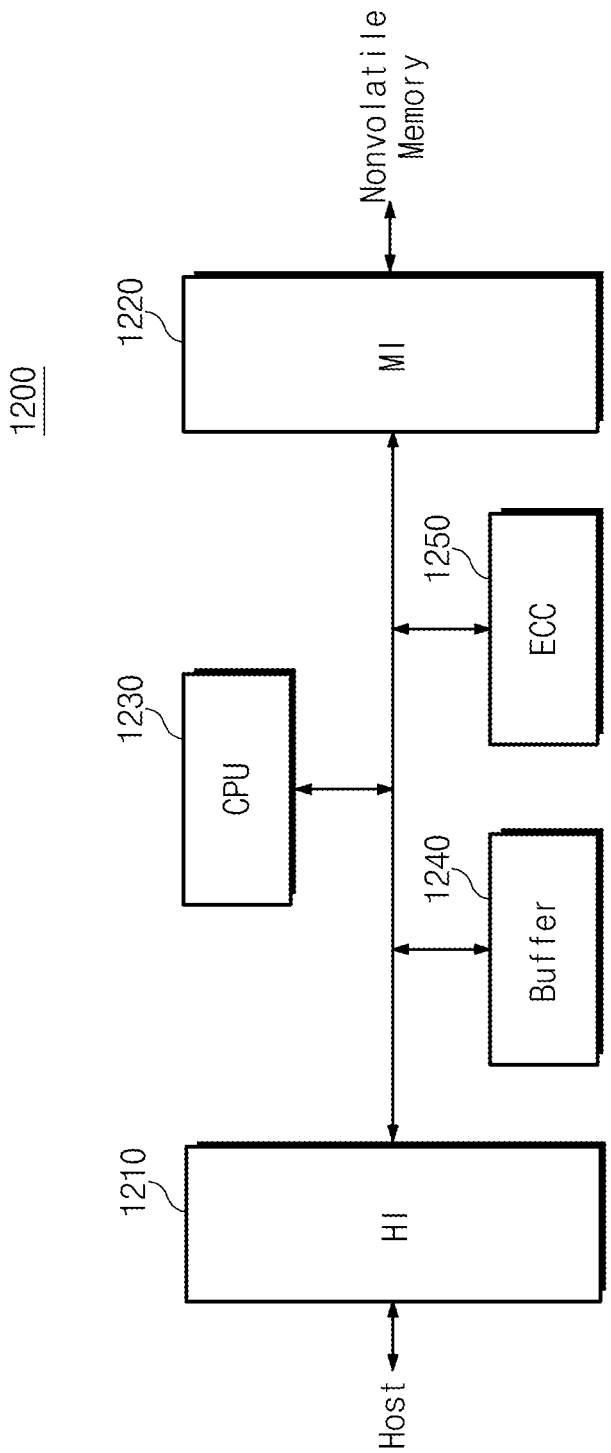
FIG. 9 is a block diagram of a memory controller in FIG. 8 according to an embodiment of the inventive concept.

FIG. 9 is a block diagram of memory controller 1200 in FIG. 8A according to an embodiment of the inventive concept.

Referring to FIG. 9, memory controller 1200 comprises a host interface 1210 as a first interface, a memory interface 1220 as a second interface, a CPU 1230, a buffer memory 1240, and an error detecting and correcting (ECC) circuit 1250.

Host interface 1210 is configured to interface with an external device (for example, a host), and memory interface 1220 is configured to interface with a nonvolatile memory device 1400 illustrated in FIG. 2. CPU 1230 is configured to control an overall operation of memory controller 1200. CPU 1230 is configured to operate firmware such as Flash Translation Layer (FTL), for example. Buffer memory 1240 is used to temporarily store data transferred from an external device via host interface 1210 or data transferred from nonvolatile memory device 1400 via memory interface 1220. Error detecting and correcting circuit 1250 is configured to encode data to be stored in nonvolatile memory device 1400 and to decode data read out from nonvolatile memory device 1400.

Although not illustrated in drawings, memory controller 1200 may further comprise a randomizer/de-randomizer configured to randomize data to be stored in nonvolatile memory device 1400 and to de-randomize data read from nonvolatile memory device 1400. An example of the randomizer/de-randomizer is disclosed in U.S. Patent Publication No. 2010/0088574, the subject matter of which is hereby incorporated by reference.

Host interface 1210 typically implements one of various computer bus standards, storage bus standards, and iFCPPeripheral bus standards, or a combination of two or more standards. Examples of such computer bus standards include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, HyperTransport, and the like. Examples of storage bus standards include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, FCIP, etc. Examples of iFCPPeripheral bus standards include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, and the like.

Figure 10:
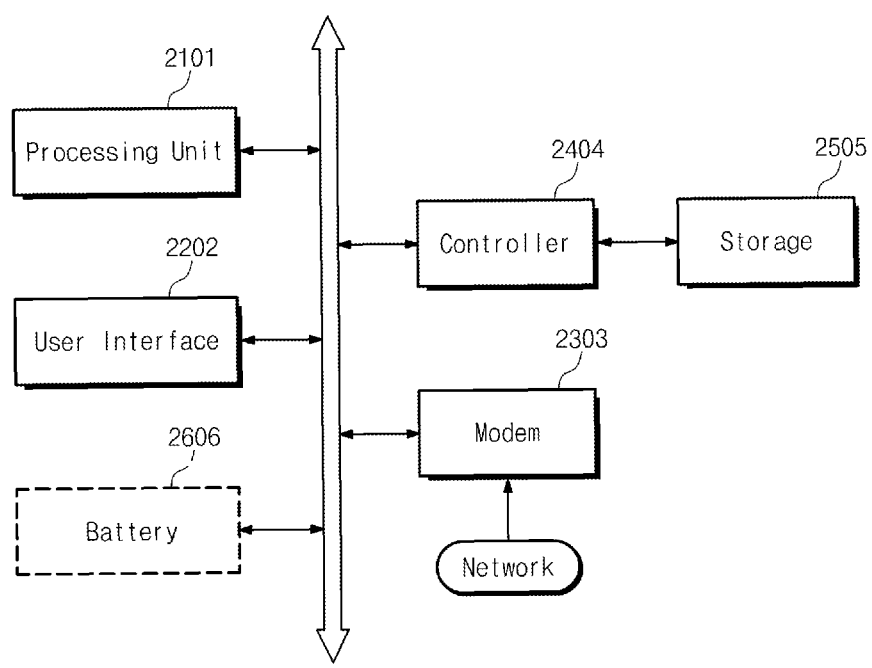
FIG. 10 is a block diagram of a computing system comprising a data storage device according to an embodiment of the inventive concept.

FIG. 10 is a block diagram of a computing system comprising a data storage device according to an embodiment of the inventive concept.

Referring to FIG. 10, the computing system comprises a processing unit 2101, a user interface 2202, a modem 2303 such as a baseband chipset, a memory controller 2404, and a nonvolatile memory device 2505 as a storage medium.

Nonvolatile memory device 2505 is configured substantially the same as the nonvolatile memory device of FIG. 1. Accordingly, nonvolatile memory device 2505 is configured to reduce of erase disturbance on memory cells having an erase state through variable control of a program pulse time.

Memory controller 2404 is configured substantially the same as illustrated in FIG. 8. Accordingly, memory controller 2404 manages a program-erase cycle number of nonvolatile memory device 2505. Memory controller 2404 determines whether a program-erase cycle number of nonvolatile memory device 2505 reaches a specific number. Where the program-erase cycle number of nonvolatile memory device 2505 reaches the specific number, memory controller 2404 controls nonvolatile memory device 2505 such that there is varied a program pulse period where a program voltage is constantly maintained.

N-bit data (N being 1 or more integer) processed/to be processed by processing unit 2101 is stored in nonvolatile memory device 2505 through memory controller 2404. Where the computing system is a mobile device, a battery 2606 may be further included in the computing system to supply an operating voltage thereto. Although not illustrated in FIG. 10, the computing system may further comprise an application chipset, a camera image processor (CIS), a mobile DRAM, and the like.

Figure 11:
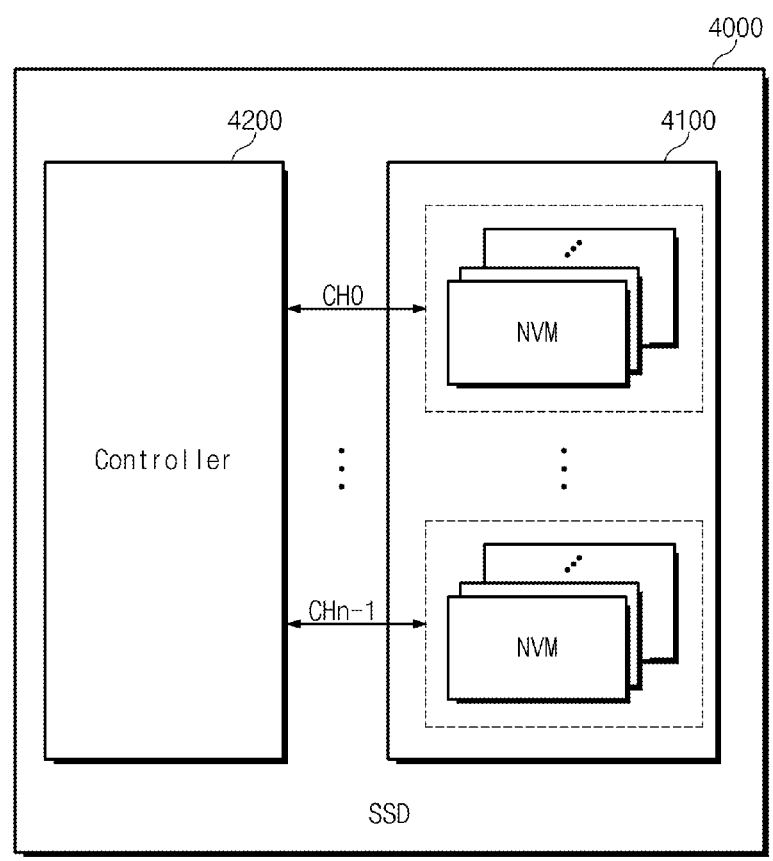
FIG. 11 is a block diagram of a solid state drive (SSD) according to an embodiment of the inventive concept.

FIG. 11 is a block diagram of an SSD 4000 according to an embodiment of the inventive concept.

Referring to FIG. 11, SSD 4000 comprises a storage medium 4100 and a controller 4200. Storage medium 4100 is connected with controller 4200 via a plurality of channels, each of which is commonly connected with a plurality of nonvolatile memories. Each nonvolatile memory device is configured substantially the same as the nonvolatile memory device of FIG. 1. Accordingly, each nonvolatile memory device is configured to improve deterioration of erase disturbance on memory cells having an erase state through variable controlling of a program pulse time.

Controller 4200 is configured substantially the same as memory controller 1200 of FIG. 8. Accordingly, controller 4200 manages a program-erase cycle number of each nonvolatile memory device. Controller 4200 determines whether a program-erase cycle number of each nonvolatile memory device reaches a specific number. Where the program-erase cycle number of each nonvolatile memory device reaches the specific number, controller 4200 controls each nonvolatile memory device such that there is varied a program pulse period where a program voltage is constantly maintained.

Figure 12:
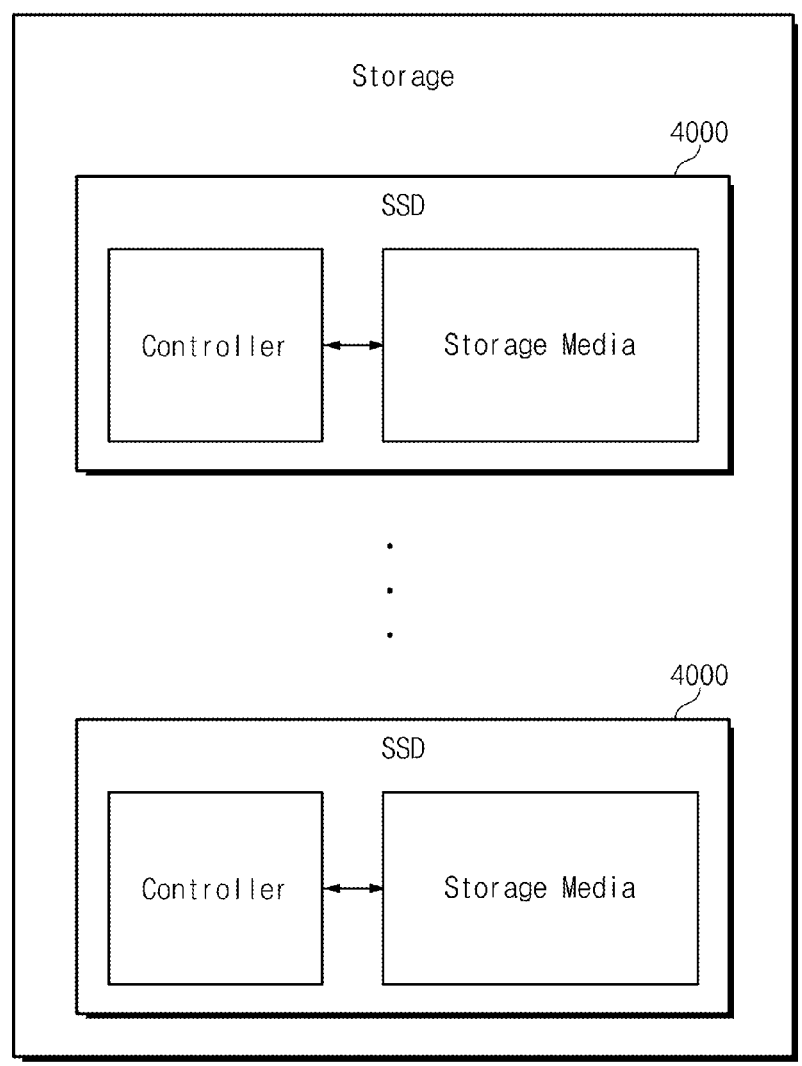
FIG. 12 is a block diagram of a storage apparatus using the SSD of FIG. 11 according to an embodiment of the inventive concept.
Figure 13:
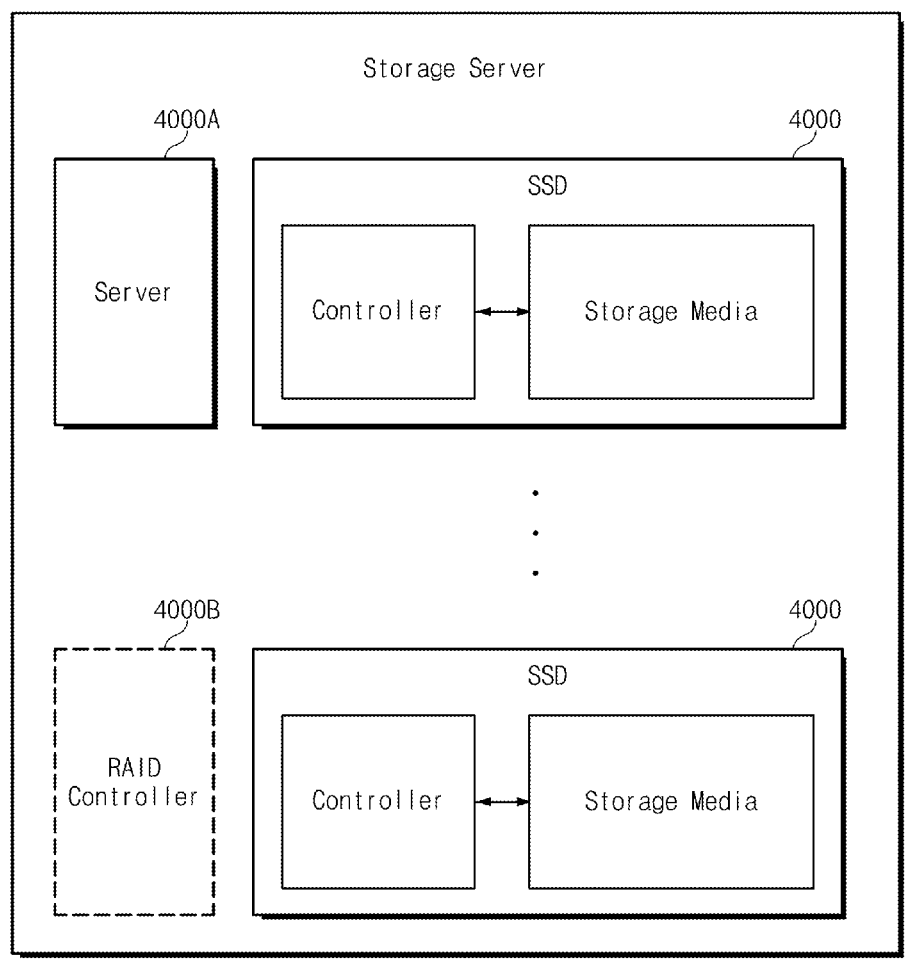
FIG. 13 is a block diagram of a storage server using the SSD of FIG. 11 according to an embodiment of the inventive concept.

FIG. 12 is a block diagram of a storage apparatus using SSD 4000 of FIG. 11 according to an embodiment of the inventive concept, and FIG. 13 is a block diagram of a storage server using SSD 4000 of FIG. 11 according to an embodiment of the inventive concept.

Referring to FIG. 12, the storage apparatus comprises a plurality of solid state drives 4000 each configured as described in relation to FIG. 11. Referring to FIG. 13, a storage server comprises a plurality of solid state drives 4000 each configured as described in relation to FIG. 11, a server 4000A, and a redundant array of independent disks (RAID) controller 4000B.

Figure 14:
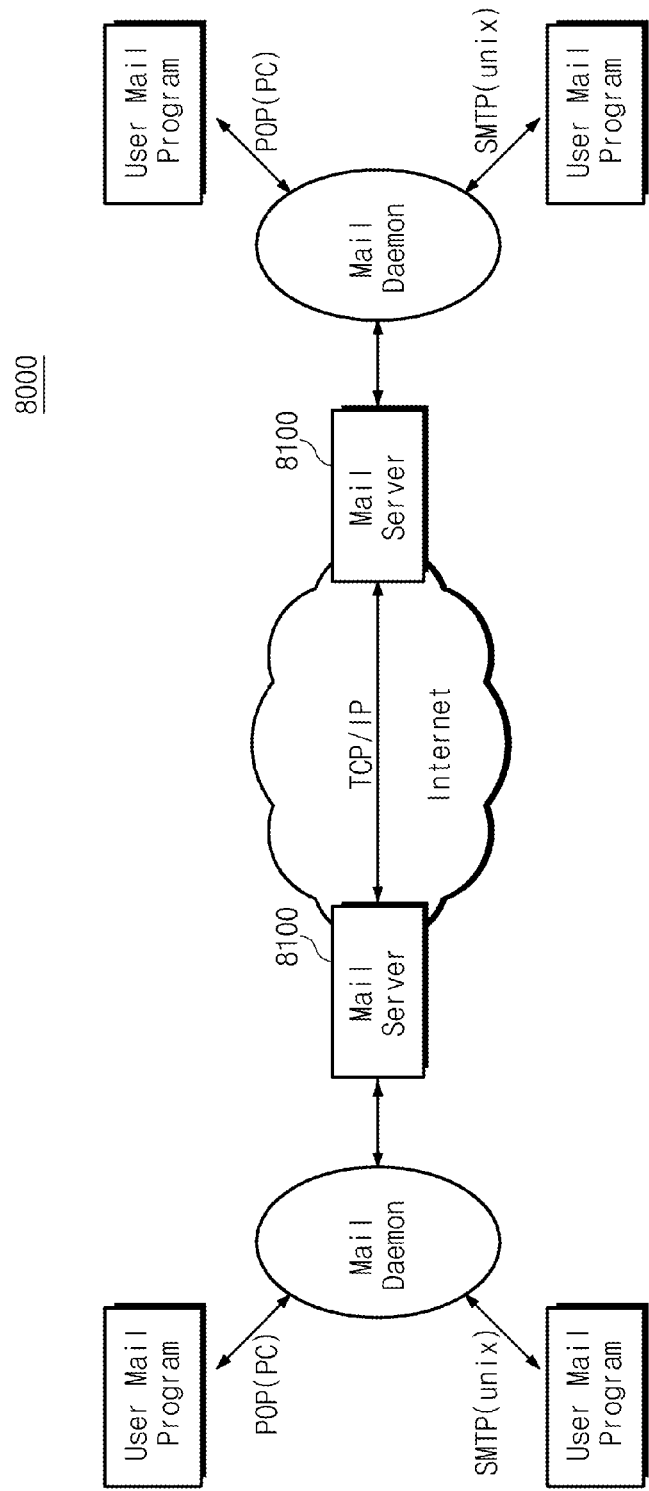
FIG. 14 is a diagram of a system incorporating a data storage device according to an embodiment of the inventive concept.

FIG. 14 is a diagram of a system 8000 incorporating a data storage device according to an embodiment of the inventive concept.

Referring to FIG. 14, system 8000 comprises a plurality of mail servers 8100 connected through a network. Mail servers 8100 each incorporate an SSD, which can be implemented similar to SSDs described above.

Figure 15:
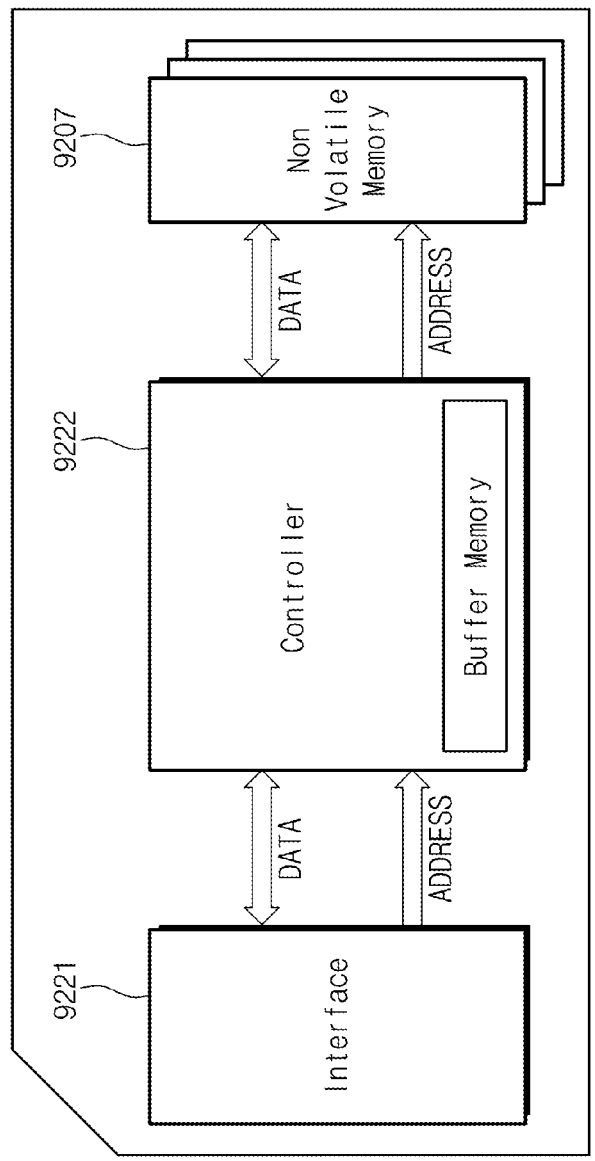
FIG. 15 is a block diagram of a memory card according to an embodiment of the inventive concept.

FIG. 15 is a block diagram of a memory card according to an embodiment of the inventive concept. The memory card may be, for example, an MMC card, an SD card, a multiuse card, a micro-SD card, a memory stick, a compact SD card, an ID card, a PCMCIA card, an SSD card, a chip-card, a smart-card, an USB card, or the like.

Referring to FIG. 15, the memory card comprises an interface circuit 9221 for interfacing with an external device, a controller 9222 including a buffer memory and controlling an operation of the memory card, and at least one nonvolatile memory device 9207. Controller 9222 may be a processor configured to control write and read operations of nonvolatile memory device 9207. Controller 9222 is coupled with nonvolatile memory device 9207 and interface circuit 9221 via a data bus and an address bus.

Nonvolatile memory device 9207 is configured substantially the same as the nonvolatile memory device of FIG. 1. That is, nonvolatile memory device 9207 is configured to improve deterioration of erase disturbance on memory cells having an erase state through variable controlling of a program pulse time. Controller 9222 is configured substantially the same as controller 1200 of FIG. 8. That is, controller 9222 may manage a program-erase cycle number of nonvolatile memory device 9207. Controller 9222 determines whether a program-erase cycle number of nonvolatile memory device 9207 reaches a specific number. When the program-erase cycle number of nonvolatile memory device 9207 reaches the specific number, controller 9222 may control nonvolatile memory device 9207 such that there is varied a program pulse period where a program voltage is constantly maintained.

Figure 16:
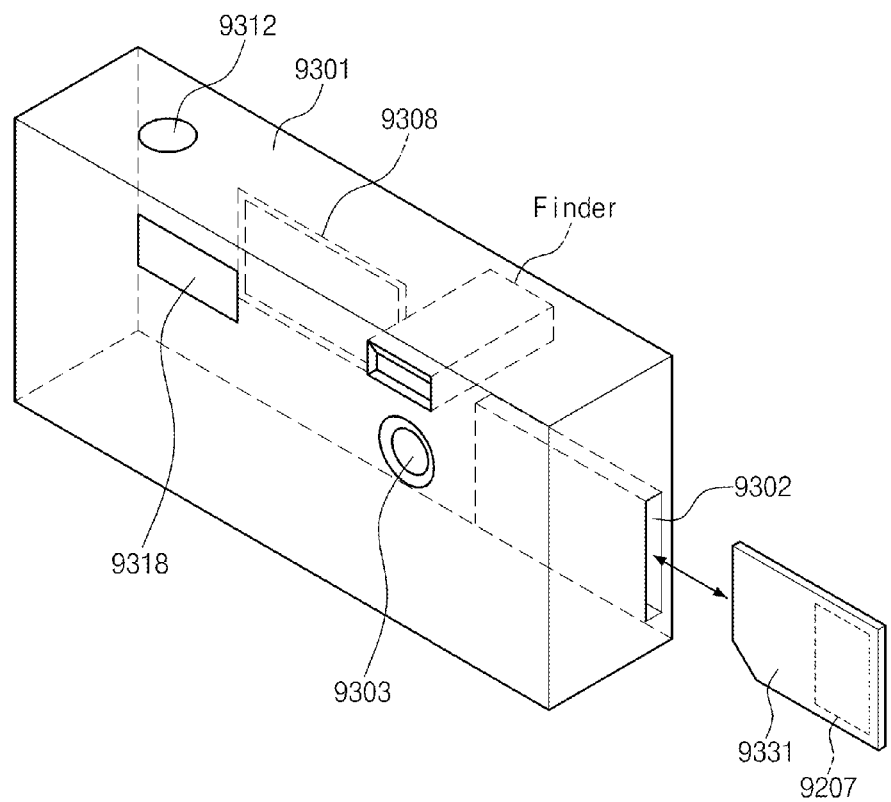
FIG. 16 is a block diagram of a digital camera according to an embodiment of the inventive concept.

FIG. 16 is a block diagram of a digital camera according to an embodiment of the inventive concept.

Referring to FIG. 16, the digital camera comprises a body 9301, a slot 9302, a lens 9303, a display circuit 9308, a shutter button 9312, and a strobe 9318. A memory card 9331 may be inserted in the slot, and comprises a memory controller described in FIG. 8 and a nonvolatile memory device described in FIG. 1. The nonvolatile memory device may be configured to improve deterioration of erase disturbance on memory cells having an erase state through variable controlling of a program pulse time. The memory controller manages a program-erase cycle number of the nonvolatile memory device, and it determines whether a program-erase cycle number of the nonvolatile memory device reaches a specific number. Where the program-erase cycle number of the nonvolatile memory device reaches the specific number, the memory controller controls the nonvolatile memory device to vary a program pulse period in which a program voltage is maintained constant.

Where memory card 9331 has a contact type, an electric circuit on a circuit board may be electrically contacted with memory card 9331 when it is inserted in slot 9302. Where memory card 9331 has a non-contact type, an electric circuit on a circuit board may communicate with memory card 9331 in a radio-frequency manner.

Figure 17:
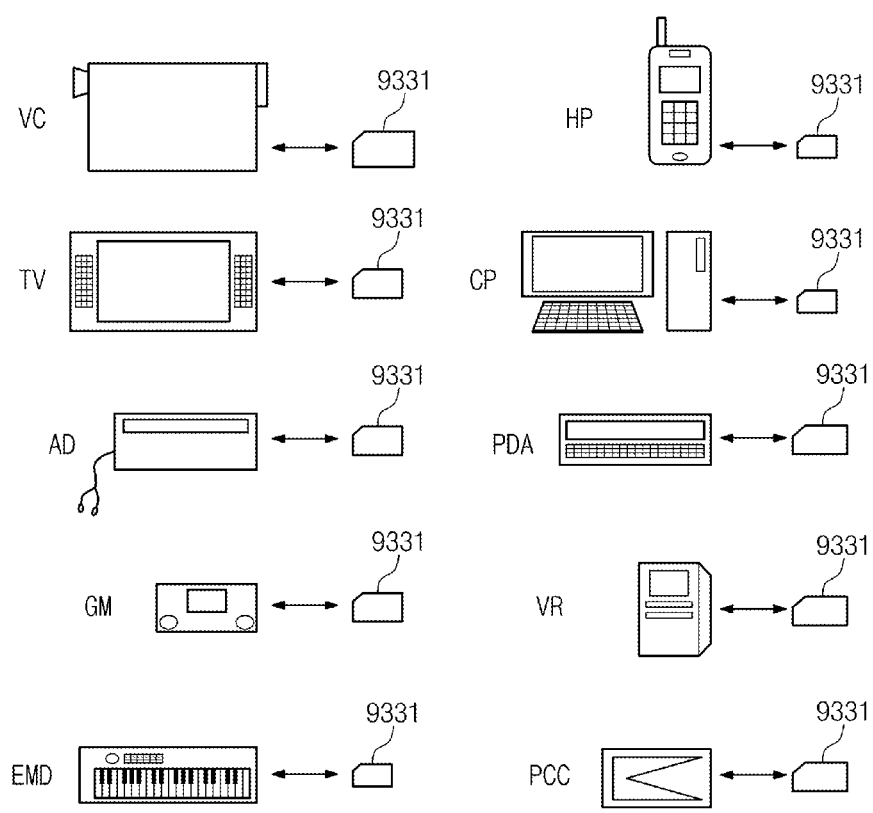
FIG. 17 is a diagram of various systems incorporating the memory card of FIG. 15 according to embodiments of the inventive concept.

FIG. 17 is a diagram illustrating various systems using memory card 9331 of FIG. 15 according to embodiments of the inventive concept.

Referring to FIG. 17, memory card 9331 can be applied to a video camera VC, a television TV, an audio device AD, a game machine GM, an electronic music device EMD, a cellular phone HP, a computer CP, a Personal Digital Assistant (PDA), a voice recorder VR, a PC card PCC, and the like.

In some embodiments, memory cells can be formed of a variable resistance memory cell. An exemplary variable resistance memory cell and a memory device including the same are disclosed in U.S. Pat. No. 7,529,124, the subject matter of which is hereby incorporated by reference.

In some embodiments, memory cells can be formed of one of various cell structures having a charge storage layer. Cell structures having a charge storage layer include a charge trap flash structure using a charge trap layer, a stack flash structure in which arrays are stacked at multiple layers, a source-drain free flash structure, a pin-type flash structure, and the like.

In some embodiments, a memory device having a charge trap flash structure as a charge storage layer is disclosed in U.S. Pat. No. 6,858,906 and U.S. Patent Publication Nos. 2004/0169238 and 2006/0180851, the subject matter of which is hereby incorporated by reference. A source-drain free flash structure is disclosed in KR Patent No. 673020, the subject matter of which is hereby incorporated by reference.

A nonvolatile memory device and/or a memory controller according to certain embodiments of the inventive concept may be packed using various types of packages. Examples of such packages or package types include Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a nonvolatile memory device, comprising:
    determining a temperature condition of the nonvolatile memory device;
    determining a program pulse period according to the temperature condition;
    supplying a program voltage to a selected word line using the program pulse period; and
    supplying a pass voltage to unselected word lines while supplying the program voltage to the selected word line.

2. The method of claim 1, further comprising increasing the program pulse period in response to a temperature decrease of the nonvolatile memory.

3. The method of claim 1, further comprising decreasing the program pulse period in response to a temperature increase of the nonvolatile memory device.

4. The method of claim 1, further comprising adjusting the program pulse period according to a physical location of the selected word line.

5. The method of claim 4, wherein a program pulse period determined where the selected word line is an uppermost word line adjacent to a bit line is shorter than a program pulse period determined where the selected word line is not the uppermost word line.

6. The method of claim 1, wherein the program pulse period determined according to a temperature variation becomes relatively shorter after a predetermined number of program loops.

7. A nonvolatile memory device comprising:
    a memory cell array comprising memory cells arranged in word lines and bit lines;
    an address decoder configured to select one of the word lines of the memory cell array;
    a temperature code generator circuit configured to detect a current temperature of the nonvolatile memory device and generate a temperature code corresponding to the detected current temperature; and
    control logic configured to control a program pulse period of a program voltage to be applied to the selected word line through the address decoder in response to the temperature code.

8. The nonvolatile memory device of claim 7, wherein the control logic controls the program pulse period to become shorter where the temperature code indicates an increase in a temperature and to become longer where the temperature code indicates a decrease in a temperature.

9. The nonvolatile memory device of claim 7, wherein the control logic further controls the program pulse period determined according to the temperature code based on a physical location of the selected word line.

10. The nonvolatile memory device of claim 9, wherein a program pulse period determined where the selected word line is the uppermost word line adjacent to a bit line is shorter than a program pulse period determined where the selected word line is not the uppermost word line.

11. The nonvolatile memory device of claim 7, wherein the control logic is further configured to determine whether a current program loop has reached a predetermined program loop number.

12. The nonvolatile memory device of claim 11, wherein where the current program loop reaches the predetermined program loop number, the control logic controls the program pulse period determined according to the temperature code to become shorter than a program pulse period before the predetermined program loop number.

13. The nonvolatile memory device of claim 7, wherein the memory cells store multi-bit data.

14. A memory system, comprising:
a nonvolatile memory device; and
a memory controller connected to the nonvolatile memory device via a channel and configured to control the nonvolatile memory device,
wherein the memory controller determines whether a program-erase cycle number of the nonvolatile memory device reaches a predetermined program-erase cycle number and changes a program pulse period of the nonvolatile memory device according to a result of the determination.

15. The memory system of claim 14, wherein where the program-erase cycle number on the nonvolatile memory device reaches the predetermined program-erase cycle number, the memory controller controls the nonvolatile memory device such that the program pulse period becomes shorter.

16. The memory system of claim 14, wherein the nonvolatile memory device and the memory controller are formed in a memory card or a solid state drive.

17. The memory system of claim 14, wherein the memory controller determines a temperature condition of the nonvolatile memory device and adjusts the program pulse period according to the temperature condition.

18. The memory system of claim 17, wherein the program pulse period is increased in response to a temperature decrease of the nonvolatile memory, and decreased in response to a temperature increase of the nonvolatile memory device.

19. The memory system of claim 14, wherein the memory controller adjusts the program pulse period according to a physical location of a selected word line to which a program pulse is to be applied using the program pulse period.

20. The memory system of claim 19, wherein a program pulse period determined where the selected word line is an uppermost word line adjacent to a bit line is shorter than a program pulse period determined where the selected word line is not the uppermost word line.

* * * * *